(12) United States Patent
Weng

(10) Patent No.: US 6,374,383 B1
(45) Date of Patent: Apr. 16, 2002

(54) DETERMINING ERROR LOCATIONS USING ERROR CORRECTION CODES

(75) Inventor: Lih-jyh Weng, Shrewsbury, MA (US)

(73) Assignee: Maxtor Corporation, Longmont, CO (US)

( * ) Notice: Subject to any disclaimer, the term of this patent is extended or adjusted under 35 U.S.C. 154(b) by 0 days.

(21) Appl. No.: 09/327,285

(22) Filed: Jun. 7, 1999

(51) Int. Cl.[7] .................. H03M 13/00; H03M 13/03
(52) U.S. Cl. ....................... 714/781; 714/793
(58) Field of Search ................ 714/781, 785, 714/784, 783, 782, 752, 758; 708/492, 530, 534

(56) References Cited

U.S. PATENT DOCUMENTS 4,841,300 A * 6/1989 Yoshida et al. ............... 341/94
5,446,753 A * 8/1995 Zook ........................... 741/784
6,031,875 A * 2/2000 Im ................................ 375/262

* cited by examiner

*Primary Examiner*—Christine T. Tu
(74) *Attorney, Agent, or Firm*—Fish & Richardson, P.C.

(57) ABSTRACT

A computation circuit for evaluating an error locator polynomial corresponding to a t-error correcting n-symbol code is described. In a first mode of operation, the computation circuit computes r syndromes in response to code word inputs. In a second mode of operation, the computation circuit is provided as inputs the coefficients of the error locator polynomial and evaluates the error locator polynomial for r location values in t+1 clock cycles. For each additional r location values, the inputs are the coefficients multiplied by a finite field element. The power of the finite field element is a multiple s of r. The value of the multiple s is initialized to one. After each next consecutive r location values are computed, sr+r is compared to n−1 and s is incremented prior to computing the next consecutive r location values if sr+1<n−1. If sr+r is ≥n−1, then no further computation of r location values is required.

23 Claims, 4 Drawing Sheets

$$\left\{\begin{array}{llllllll}
\sigma(x) & \alpha^6 & \alpha^5 & \alpha^4 & \alpha^3 & \alpha^2 & \alpha^1 & \alpha^0 \\
\sigma(\alpha^0) & \sigma_6 & +\sigma_5 & +\sigma_4 & +\sigma_3 & +\sigma_2 & +\sigma_1 & +\sigma_0 \\
\sigma(\alpha^1) & \sigma_6(\alpha^6) & +\sigma_5(\alpha^5) & +\sigma_4(\alpha^4) & +\sigma_3(\alpha^3) & +\sigma_2(\alpha^2) & +\sigma_1(\alpha^1) & +\sigma_0(\alpha^0) \\
\sigma(\alpha^2) & \sigma_6(\alpha^{12}) & +\sigma_5(\alpha^{10}) & +\sigma_4(\alpha^8) & +\sigma_3(\alpha^6) & +\sigma_2(\alpha^4) & +\sigma_1(\alpha^2) & +\sigma_0(\alpha^0) \\
\sigma(\alpha^3) & \sigma_6(\alpha^{18}) & +\sigma_5(\alpha^{15}) & +\sigma_4(\alpha^{12}) & +\sigma_3(\alpha^9) & +\sigma_2(\alpha^6) & +\sigma_1(\alpha^3) & +\sigma_0(\alpha^0) \\
\vdots \\
\sigma(\alpha^6) & \sigma_6(\alpha^{36}) & +\sigma_5(\alpha^{30}) & +\sigma_4(\alpha^{24}) & +\sigma_3(\alpha^{18}) & +\sigma_2(\alpha^{12}) & +\sigma_1(\alpha^6) & +\sigma_0(\alpha^0) \\
\vdots \\
\sigma(\alpha^{r-1}) & \sigma_6(\alpha^{r-1})^6 & +\sigma_5(\alpha^{r-1})^5 & +\sigma_4(\alpha^{r-1})^4 & +\sigma_3(\alpha^{r-1})^3 & +\sigma_2(\alpha^{r-1})^2 & +\sigma_1(\alpha^{r-1})^1 & +\sigma_0(\alpha^{r-1})^0 \\
\sigma(\alpha^{n-1}) & \sigma_6(\alpha^{n-1})^6 & +\sigma_5(\alpha^{n-1})^5 & +\sigma_4(\alpha^{n-1})^4 & +\sigma_3(\alpha^{n-1})^3 & +\sigma_2(\alpha^{n-1})^2 & +\sigma_1(\alpha^{n-1})^1 & +\sigma_0(\alpha^{n-1})^0
\end{array}\right\} n$$

FIG. 3

DETERMINING ERROR LOCATIONS USING ERROR CORRECTION CODES

BACKGROUND OF THE INVENTION

The invention relates generally to error correction code decoding mechanisms and more particularly to the decoding of Bose-Chaudhuri-Hocquenghem (BCH) correction codes, including Reed-Solomon error correction codes.

The use of increasingly higher density storage media in digital computer systems has caused an increase in the potential for defect-related data errors. To reduce data loss as a result of such data corruption, error correction codes are employed to correct the erroneous data.

Prior to storing data on a storage device, such as a magnetic disk, it is encoded to form redundancy symbols. The redundancy symbols are appended to the data symbols to form code words, which are then stored on the storage device. When the stored data is retrieved from the storage device for decoding, the redundancy symbols provide information which allows the decoder to recognize errors and, if possible, reconstruct the original code word. For a detailed description of decoding, see Peterson and Weldon, Error Correction Codes, 2d Edition, MIT Press, 1972.

One widely-used error correction code is the Reed-Solomon code. Error detection and correction techniques for Reed-Solomon codes are well known.

To correct detected errors, a decoder must determine the locations and values (or magnitudes) of the detected errors. The decoder first computes error syndromes, which it then uses to generate an error locator polynomial. Once the error locator polynomial has been generated, each error location and value may be determined.

Error locations are determined by solving for the roots of the error locator polynomial $\sigma(x)$ of degree "t" where t is the number of errors that can be corrected. The solution or roots of the equation $\sigma(x)=0$ correspond to the locations of the errors. These roots are of the form $x=\alpha^i$, where 60 is the primitive element of the Galois Field $GF(p^q)$ used to encode the data. Once all t roots have been found, the corresponding error values are calculated using the well-known Forney algorithm. The data can then be corrected to produce an error-free data symbol.

One of the most efficient techniques for root finding is the so-called Chien search, which is a systematic trial-and-error root finding technique widely employed in error correcting systems. The Chien search systematically tries each element $x=\alpha^i$ of $GF(p^q)$ as a possible solution to the error locator polynomial equation $\sigma(x)=0$. Each time a new value of x is evaluated, t Galois Field multiplication operations and t Galois Field addition operations are performed to determine if x is a solution. Because the Chien search evaluates one element (or location value) at a time, the time to complete the entire search is independent of the degree t of the error locator polynomial $\sigma(x)$ under investigation.

SUMMARY OF THE INVENTION

In one aspect of the invention, a computation circuit in a decoder is operated in a first mode to compute syndrome values in response to a first set of inputs. When used in a second mode, the computation circuit computes location values in response to a second set of inputs.

Embodiments of the invention may include one or more of the following features.

The first set of inputs may correspond to code word polynomial coefficients. The second set of inputs may correspond to error locator polynomial coefficients of an error locator a polynomial.

The computation circuit may include r parallel computation stages. In the first mode, the computation circuit can compute r syndromes for the first set of inputs. In the second mode, the computation circuit can compute greater than r location values.

For an error locator polynomial of a degree t, operating the computation circuit in the second mode can further include computing a different one of the r location values in a corresponding one of the r parallel computation stages during t+1 clock cycles.

The computation circuit may be operated in the second mode of operation to compute a number of location values greater than r by scaling the second set of inputs. The second set of inputs may be scaled by multiplying each error locator polynomial coefficient in the second set of inputs by a Galois Field element so that location values are computed for Galois Field elements of a power greater than r.

The power of the Galois Field element by which the error locator polynomial coefficients can be multiplied may be a multiple of r.

A zero or non-zero condition may be determined for each of the computed location values. The computed location values which are determined to be equal to zero are roots of the error locator polynomial and may be used to obtain error positions.

The computational scheme of the present invention offers several advantages. It reduces the amount of circuitry required to implement a decoder by allowing the error location polynomial root search to share syndrome computation circuitry with the syndrome generator of the decoder. Also, the root search is faster that the conventional Chien search. Moreover, the search speed increases as the degree of the polynomial becomes smaller, a property of particular importance when the number of errors to be corrected is smaller than the code error-correction capability of the decoder.

Other features and advantages of the invention will be apparent from the following detailed description and from the claims.

BRIEF DESCRIPTION OF THE DRAWINGS

FIG. 3 is an illustration of a error locator polynomial of degree t=6 for n values of the finite field element.

DETAILED DESCRIPTION

The present invention features a circuit which computes both syndromes and error locations. Prior to a discussion of the present invention, a typical decoder employing a syndrome computation circuit and a separate error location computation circuit will be considered.

Figure 1:
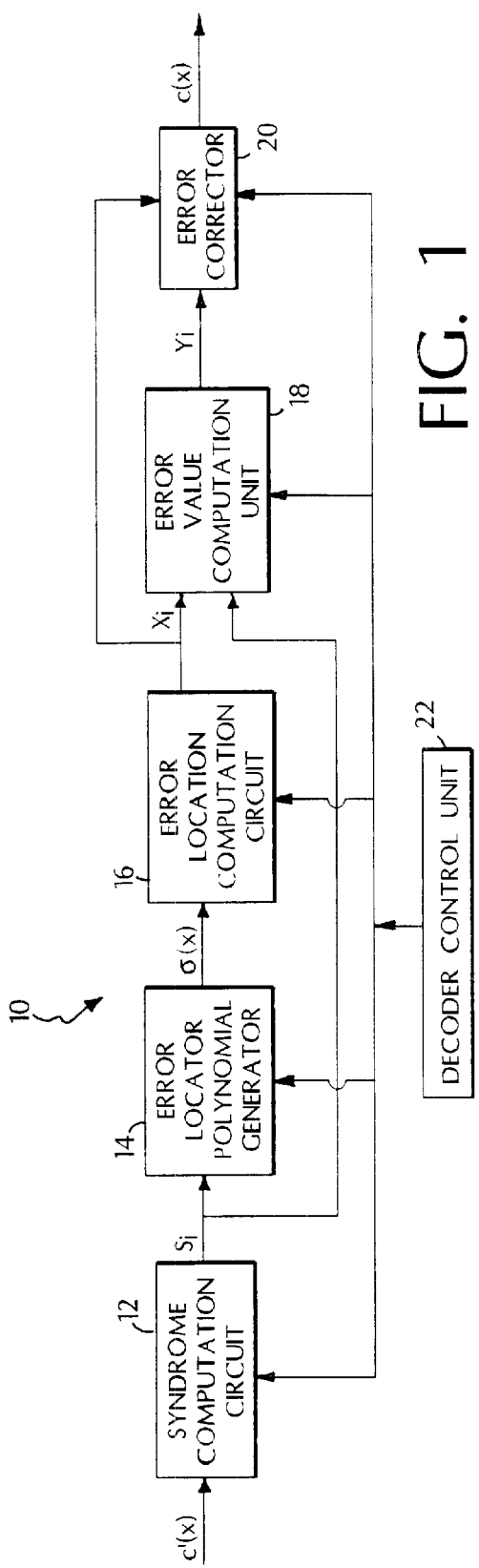
FIG. 1 is an block diagram of a Reed Solomon decoder.

Referring to FIG. 1, an exemplary Reed-Solomon code decoder 10 is shown. The Reed Solomon decoder 10 includes an arrangement of functional units, including a syndrome computation circuit 12, an error locator polynomial generator 14, an error location computation (or root finding) circuit 16, an error value computation unit 18 and an error corrector 20. Control of each of these functional units is effected by a decoder control unit 22.

The decoder 10 receives as an input a code word c(x), which may contain some error e(x). The received code word, i.e., c(x)+e(x), thus may be referred to as c'(x). The code word c(x) of n symbols includes k information or data symbols d(x) and r (i.e., "n–k") redundancy symbols r(x). Each of the symbols is m bits in length. The redundancy symbols are derived by dividing the information symbols by a generator polynomial g(x). Division results in a quotient q(x), which is ignored, and a remainder r(x). The remainder includes the redundancy symbols which are then added to the n–k lowest order locations of c(x). With Reed-Solomon codes, the number of redundancy symbols r to correct an error must be at least twice the number of errors t that are to be corrected; thus, there must be r≧2t redundancy symbols in a t-error-correcting code. As the order of the remainder corresponds to the order of the divisor, the generator polynomial implemented for a t error correcting code Reed-Solomon code having $n=2^m-1$, m-bit symbols is as follows:

$$g(x) = (x-\alpha^L)(x-\alpha^{L+1}) \ldots (x-\alpha^{L+r-1}) \qquad \text{Eq. (1)}$$

where $\alpha^i$ for i=L, L+1, ... L+r–1, is a field element of $GF(2^m)$ and L is a constant of the Galois field factor $(x-\alpha^i)$. The code word c(x) is a multiple of both the generator polynomial and each of its factors or roots. Thus, the division of the received word c'(x) by the generator polynomial g(x) or each of its roots, if the received worked contains no errors, results in some quotient and a remainder of zero.

Still referring to FIG. 1, the codeword c'(x) is applied to the syndrome computation unit 12. For error correction purposes, it is necessary to generate a number of syndromes equal to twice the number of errors being corrected, i.e., 2t. The syndrome is defined as the remainder after dividing the received word c'(x) by a root $(x-\alpha^i)$ of the generator polynomial g(x). This is the equivalent of evaluating the received polynomial c'(x) at $\alpha^i$, i.e., $c'(\alpha^i)$. As there are t such roots, there are 2t syndromes. The syndromes are mathematically related to error locations and error values by the relationship:

$$S_j = \sum_{0}^{t-1} Y_i X_i^j \qquad \text{Eq. (2)}$$

where $X_i$ are the error locations and the $Y_i$ are the error values, and $S_{j=c'(\alpha^j)}$. $X_i$ is an element of the Galois field and the power of $\alpha$ corresponds to the location of the symbol error, i.e., if $X_i = \alpha^{83}$, the 83rd symbol is in error. The value of $Y_i$ is also an element of Galois Field $GF(2^m)$ and corresponds to the error pattern.

Therefore, the received code word c'(x) is tested for the presence of errors by computing syndromes $S_j=c'(\alpha^j)$, where j=L, L+1, ..., L+r–1. If all syndromes $S_j$ are zero, then there is no error and therefore no need for further decoding. If at least one $S_j$ is nonzero, the codeword c'(x) must be subject to further processing by the decoder 10.

Once the syndromes have been computed by the syndrome computation circuit 12, they are provided to the error locator polynomial generator 14, which calculates the coefficients of an error locator polynomial according to known algorithms, such as the Berlekamp-Massey or Euclidean algorithms. The error locator polynomial is of the form:

$$\sigma(x) = \sigma_t x^t + \sigma_{t-1} x^{t-1} + \sigma_{t-2} + \sigma_{t-3} x^{t-3} + \sigma_2 x^2 + \sigma_1 x + \sigma_0 \qquad \text{Eq. (3)}$$

for a t-error correcting code.

The coefficients of the error locator polynomial σ(x) generated by the error locator polynomial generator 14 are transferred to the root finding circuit 16. The root finding circuit 16 evaluates σ(x) for each power of $\alpha^j$, j=0, 1, 2, 3, ..., n–1 (n being the total number of symbols in the codeword c'(x)) and determines if the result is zero or non-zero. The values of σ(x) equal to zero correspond to error locations $X_i$, which are provided to the error values computation unit 18 and the error corrector 20, as shown. A detailed example of the root finding circuit 16 is described below with reference to FIG. 2.

Still referring to FIG. 1, the error values computation unit 18 receives as inputs the error locations $X_i$ and the syndromes $S_i$ and computes error values $Y_i$ using known techniques, such as the well-known Forney algorithm.

The error corrector 20 receives each error location $X_i$ and error value $Y_i$ from the error location computation circuit 16 and the error values computation unit 18, respectively. It adds the error value $Y_i$ to the corresponding erroneous symbol read from the error location $X_i$ to produce an error-free symbol of codeword c(x).

Figure 2:
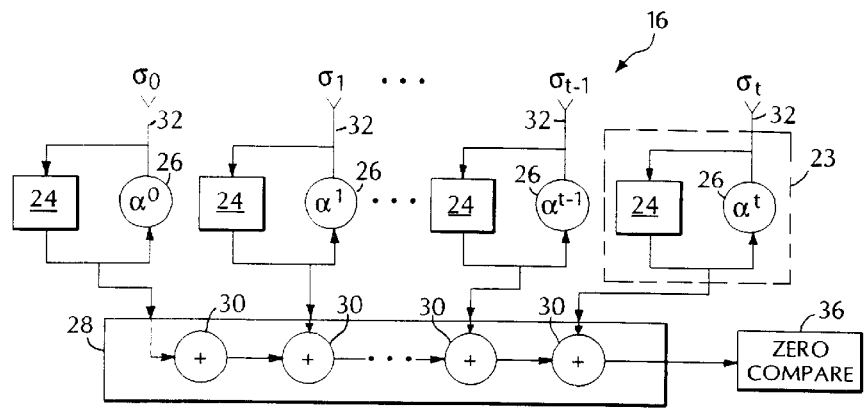
FIG. 2 is a circuit diagram of a prior art Chien search circuit.

Referring to FIG. 2, an exemplary Chien search circuit for implementing the error location computation circuit 16 of FIG. 1 is shown. The Chien search circuit 16 includes t+1 number of multiplier circuits 23, each including a register 24 coupled to a Galois Field multiplier 26 for multiplying the contents of the register 24 by the corresponding power of $\alpha$ and providing feedback into the register 24. Coupled to the multiplier circuits 23 is a summation unit 28, which includes t modulo 2 adders (XOR gates) 30 serially connected to one another and also connected to the outputs of the registers 24. Alternatively, the summation unit 28 may be implemented as an XOR tree to reduce XOR delay. An additional input to each register 24 is the corresponding coefficient of the error locator polynomial (of Eq. 3) 32. In the embodiment shown, the coefficients 32 are presented to the registers 24 with the highest order coefficient first and the lowest order coefficient last. Initially, these coefficients are parallel-loaded into their corresponding registers 24. Thereafter, the registers 24 are clocked by decoder control unit 22 (FIG. 1) to form in the registers 24 the values $\sigma_o \alpha^o, \sigma_1 \alpha^1, \sigma_2 \alpha^2, \sigma_3 \alpha^3, \ldots \sigma_t \alpha^t$. That is, each coefficient $\sigma_j$ is multiplied by the appropriate multiplier $\alpha^j$ 26 and the resulting value is stored in the register 24. The stored values are summed by the adders 30 and compared to zero by a zero compare unit 36. If the result of the zero compare unit 36 indicates a value of zero, then that value of x is a root and therefore corresponds to an error location. The actual location of the error may be established by an $\alpha^i$ counter in the decoder control unit 22.

The circuitry of the Chien search circuit 16 is clocked n times to evaluate n values of x, i.e., $x=\alpha^o, \ldots, \alpha^{n-1}$, to test for all powers of $\alpha$. Thus, the next clocking of coefficients through the circuit multiplies $\alpha^i$ times the contents of the particular register 24 to which the $\alpha^i$ multiplier is coupled, e.g., $\alpha^1$ multiplied by the stored $\sigma_1 \alpha^1$ to give $\sigma_1 \alpha^2$.

FIG. 3 illustrates the resulting σ(x) of a degree t=6 for each value of x. The values of x shown represent "n" iterations or cycles of the Chien search circuit of FIG. 2.

Figure 4:
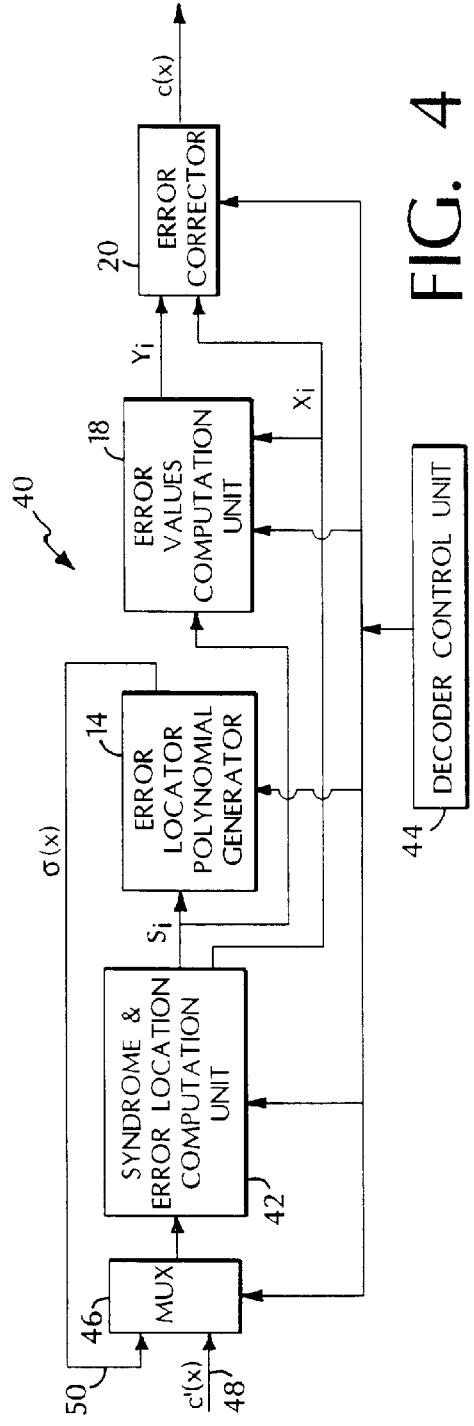
FIG. 4 is a block diagram of the Reed Solomon decoder of FIG. 1 having a computation circuit for performing syndrome computations and error location computations.

In accordance with the present invention, and as shown in FIG. 4, a decoder 40 includes a syndrome and error location computation unit (or, simply, computation unit) 42 which performs two different functions in two modes of operation. That is, in a first mode of operation, the computation unit 42 performs the error checking/syndrome generation of the syndrome computation circuit 12, while in a second mode of operation the computation unit 42 performs the error location or root finding function of the root finding circuit 16 of FIG. 1. A decoder control unit 44 selects the operating mode of the unit 42 and, in accordance with that selection, controls the MUX 46 to apply either a first set of inputs corresponding to c'(x) 48 or a second set of inputs corresponding to σ(x) 50 to computation unit 42. It will be appreciated that the MUX 46 could be placed inside the syndrome and error location computation unit 42 in an alternative implementation. Other functional units of the decoder 40 are as depicted in FIG. 1. Like reference numerals are used to indicate like functional units as appropriate.

Figure 5:
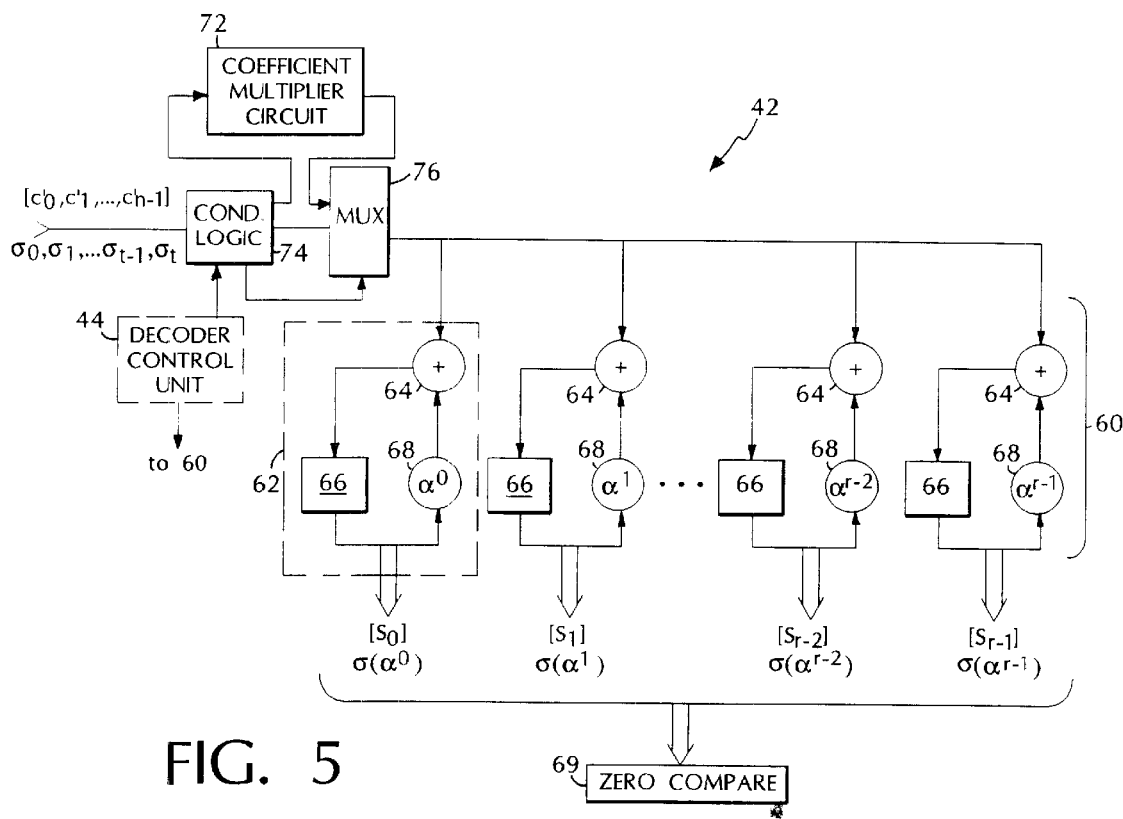
FIG. 5 is a detailed circuit diagram of the syndrome and error location computation circuit of FIG. 4.

As shown in FIG. 5, the computation unit 42 includes a H computation circuit 60 having r parallel computation stages shown as r multiply-accumulate finite field circuits 62. Each of the circuits or stages 62 includes an adder 64, a register 66 and a finite field multiplier 68. The output of each of the parallel computation stages is connected to a zero compare unit 69.

The selection between the sets of inputs by the MUX 46 (FIG. 4) allows the computation circuit 60 to operate in one of the two modes of operation. In a first mode of operation, at the direction of the decoder control unit 44, which causes the MUX 46 to select the first set of inputs corresponding to the coefficients associated with the code word polynomial c'(x) to be provided to the computation unit 42, the computation circuit 50 performs computations of syndrome values. The syndrome values $S_k$ can be expressed as $$S_k = \Sigma (\alpha^k)^i c_i \qquad \text{Eq. (4)}$$

where the summation is done over i from 0 to n−1 and $c'_i$ are the retrieved $i^{th}$ code word symbol. It is clear that if a function is defined as $$c'(x) = c'_{n-1} x^{n-1} + c'_{n-2} x^{n-2} + \ldots + c'_2 x^2 + c'_1 x + c'_0 \qquad \text{Eq. (5)}$$

then the syndrome value $S_k$ is $c'(\alpha^k)$. For an r-redundant symbol Reed-Solomon code, the circuit 60 computes r consecutive roots of the form $c'(\alpha^k)$ for k=L, L+1, ..., L+r−1. In the embodiment shown, the value of constant L is assumed to zero. Thus, when the circuit 60 is used to compute syndrome values, the coefficients of the received code word polynomial c'(x) 48 (shown N in brackets) are provided as inputs to each given adder 64 in sequence, starting with the highest order term first. After the last coefficient has been received, each register 66 contains a syndrome value $S_k$. The sequential evaluation of the code word of n−1 requires n cycles of the multiplier 68. The set of r syndromes can be computed with the same circuitry for $\alpha^k$, k=0 to r−1. Thus, in this parallel implementation, r computations are performed at the same time using r constant finite field multipliers 68 and r adders 64.

The received word c'(x) is provided, coefficient by coefficient, as one set of inputs to the adders 64. The output from the multiplier 68 is provided as the second input to the adder 64. The adder 64 XORs, bit by bit, the correspondingly ordered bits of its two inputs. The output of the adder 44 is stored in a register 66. Each output of register 66 is provided, bit by bit, to the multiplier 68 until all of the symbols of the received code word c'(x) have been clocked through the circuits 62. The syndrome that remains in each register 66 is subsequently clocked out and tested for a zero or non-zero condition by the zero compare unit 69.

The circuit 60 as described thus far operates as a conventional syndrome generator, such as the type that would be used as the syndrome computation circuit 12 (FIG. 1). The syndromes $S_i$, in conjunction with the other r−1 syndromes, are then used by the error locator polynomial generator 14 (FIG. 4) to calculate the coefficients of the error locator polynomial σ(x).

Still referring to FIG. 5, in the second mode of operation, a second set of inputs corresponding to the coefficients of σ(x)(see Eq. 3) produced by the error locator polynomial generator 14 (from FIG. 4) are provided as inputs to the syndrome and error location computation unit 42 by MUX 46 (FIG. 4) under the control of the decoder control unit 44 (FIG. 4). The evaluation of σ(x) at $\alpha^k$ yields an error location at $\alpha^{-k}$ if $σ(\alpha^k)=0$. It can be seen that, applying the t+1 symbols of coefficients of σ(x) directly to the computation circuit 60 of FIG. 5, the results of $σ(\alpha^k)$ for k=0, 1, 2, ..., r−1 are readily available after the last coefficient $σ_0$ is fed to the circuit. Because the circuit 60 is no larger than necessary to compute all r syndromes (in the first mode of operation), the circuit 60 can only be used in the second mode of operation to evaluate the error locator polynomial for r elements (consecutive powers of α) or location values in a given number (t+1) of clock cycles.

Thus, and still referring to FIG. 5, the computation unit 42 includes other circuitry to assist in evaluating the remaining elements of the Galois field as potential roots of the polynomial. The other circuitry includes a coefficient multiplier circuit 72, a conditional logic circuit 74 and a selecting device shown as a MUX 76.

Figure 6:
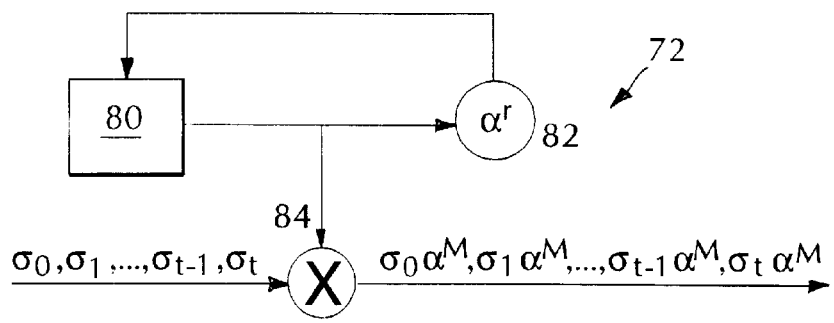
FIG. 6 is a detailed circuit diagram of the coefficient multiplier circuit shown in FIG. 5.

Referring to FIG. 6, the coefficient multiplier circuit 72 includes a register 80, a constant finite field $\alpha^r$ multiplier 82 and a coefficient multiplier 84 for multiplying $σ_t$ with a Galois field element $\alpha^M$. Thus, the polynomial to be evaluated becomes $$\sigma(\alpha^M x) = \sigma_t(\alpha^M)^t x^t + \sigma_{t-1}(\alpha^M)^{t-1} x^{t-1} + \qquad \text{Eq. (6)}$$
$$\sigma_{t-2}(\alpha^M)^{t-2} x^{t-2} + \sigma_{t-3}(\alpha^M)^{t-3n-} x^{t-3} +$$
$$\sigma_2(\alpha^M)^2 x^2 + \sigma_1(\alpha^M) x + \sigma_0$$

and the coefficients being applied to the computation circuit 60 are $\sigma_j(\alpha^M)^j$ instead of $\sigma_j$. The results of the location value computation are therefore $σ(\alpha^M \alpha^k)$ for k=0, 1, 2, ..., r−1. By setting M equal to a multiple s of r (e.g., M=s*r), with s=1, 2, 3 ..., until M+r ≥n−1, all possible Galois field elements of interest are tested. The contents of the register 80 are multiplied by the $\alpha^r$ multiplier 82 and again stored in the register each time a set of coefficients is applied to the coefficient multiplier circuit 72. The incoming coefficients are then multiplied by the contents of the register 80. The initial value of the register 80 is set to one by the conditional logic unit 74 (FIG. 5).

Returning to FIG. 5, the conditional logic unit 74 receives clock/control signals from the decoder control unit 44 (shown here in dashed lines) of FIG. 4. For the first t+1 cycles, the conditional logic unit 74 applies the σ(x) coefficients to the MUX 76 and controls the MUX 76 to apply the the σ(x) coefficients to the circuits 62 of the circuit 60. For greater than t+1 cycles, the conditional logic unit 74 applies the σ(x) coefficients to the coefficient multiplier circuit 72 and controls the MUX 76 to apply the output of the coefficient multiplier circuit 72 to the circuits 62 of the circuit 60. Additionally, the conditional logic unit 74 maintains a count for the multiple-of-r value s.

Although not described above, it will be recognized that the c'(x) coefficients (shown in brackets), when selected by the MUX 46, are applied to the input of the conditional logic unit 74 in the same manner as the error locator polynomial coefficients. As there are n clock cycles necessary to compute the r syndromes, the conditional logic unit 44 is directed by the controller unit 44 to transfer the n number of c'(x) coefficients to the MUX 76 for input to the circuit 60. Consequently, the c'(x) coefficients are not routed by the conditional logic unit 74 to the coefficient multiplier circuit 72 after only t+1 cycles as are the error locator polynomial coefficients.

Figure 7:
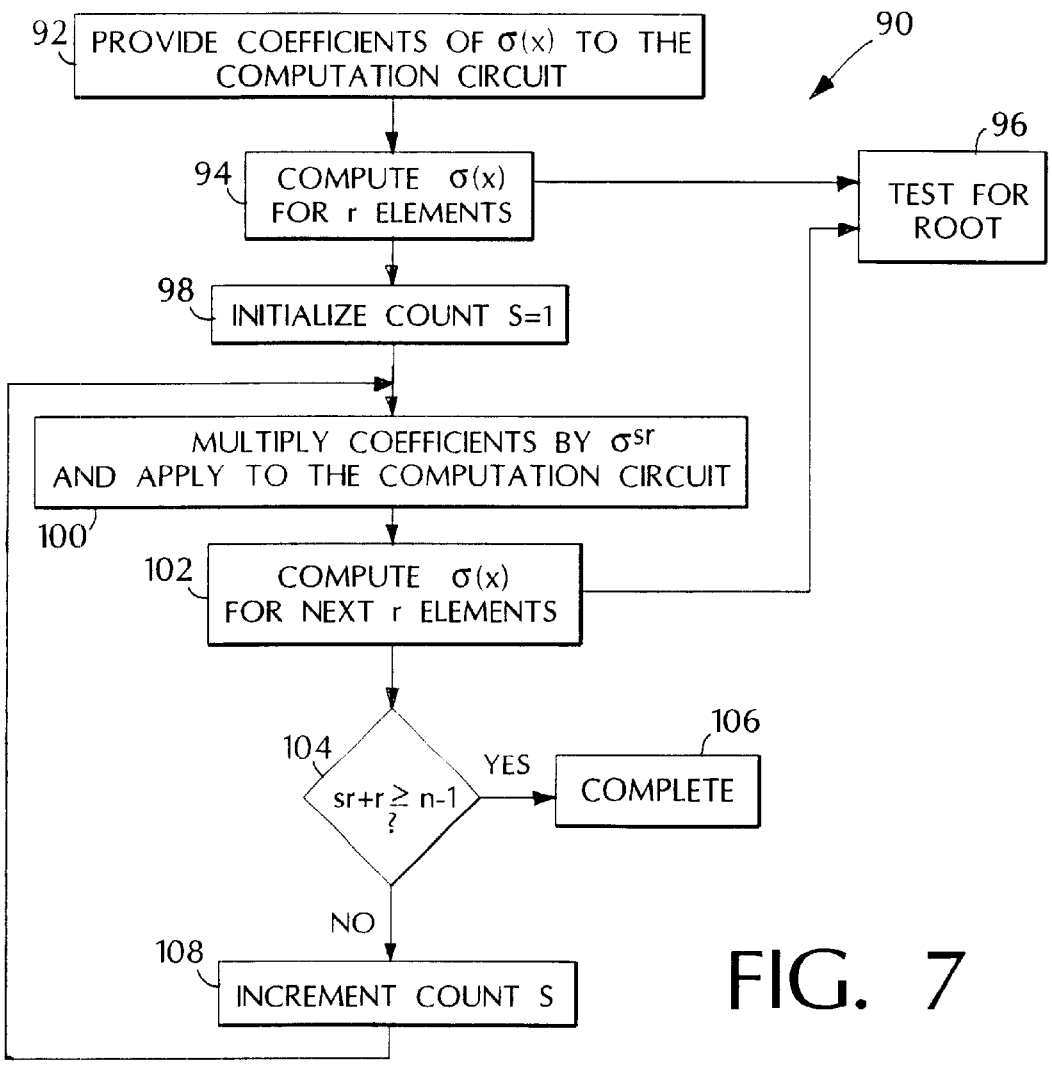
FIG. 7 is a flow diagram of a process of finding roots of an error locator polynomial using the syndrome and error location computation unit of FIG. 5.

Referring to FIG. 7, a root finding process 90 performed by the unit 42 of FIG. 5 is shown. The error locator polynomial coefficients are provided to the computation circuit 60 (step 92), which computes σ(x) for a first consecutive r elements or location values in t+1 clock cycles (step 94). The the zero compare unit 69 tests individually the computed location values to determine if the computed location values are roots by comparing the computed location value of σ(x) to zero (step 96). Having evaluated σ(x) for $\alpha^o, \ldots, \alpha^r$ the conditional logic unit 74 initializes a count s to one (step 98). The coefficient multiplier circuit 72 multiplies each coefficient by $\alpha^{sr}$ to produce a modified or scaled coefficient and applies the modified coefficient via MUX 76 to the inputs of the circuit 60 (step 100). The circuit 60 then computes then next consecutive r elements, i.e., elements 2r through 2r−1 in t+1 clock cycles (step 102). The zero compare unit 69 again tests each computed location value a as a possible root (step 96). The conditional logic unit 74 then reads count s and determines if sr+r≧n−1 (step 104). If sr+r≧n−1, then no further computations are required and the process is complete (step 106). If it is determined at step 104 that sr+r<n−1, the count s is incremented by one (step 108) and the process returns to step 100 (i.e., the coefficients are again applied to the coefficient multiplier circuit 72, and so forth).

As indicated above, the error location k actually corresponds to the conditions $\sigma(\alpha^{-k})=0$ instead of $\sigma(\alpha^k)=0$. Using the above approach, the root found, i.e., $x=\alpha^k$ is thus mapped to a location $2^m-1-k$, where $2^m$ is the number of field elements in the Galois field. The error location k may be derived from this result. To directly map the exponent of the root to the error location k, the reciprocal polynomial of σ(x) instead of σ(x) itself could be used by changing the order in which the error locator polynomial coefficients are applied to the computation circuit 60 to $\sigma_o, \sigma_1, \sigma_2, \ldots \sigma_{t-1}, \sigma_t$; in other words, $\sigma_o$ would be the first element applied to the computation circuit 60.

In the illustrated embodiment of FIG. 5, the value of Galois field constant L is assumed to be zero. Therefore, the roots for the Reed-Solomon code generator polynomial run from 0 to r−1. If L is a nonzero value and the lowest root of the Reed-Solomon code thus starts at the nonzero value of L, then the field elements to be tested are in the order: L, L+1, ..., L+r−1, L+r, L+r+1, ..., L+2r−1, L+2r, L+2r+1, ..., L+sr−1, L+sr, ... To test the elements in the natural order of 0, 1, 2, ..., for the case of L≠0, the coefficients of $\sigma_j$ can be modified to be $\sigma_j\alpha^{-L}$ by simply multiplying each coefficient by an L-offset multiplier constant $\alpha^{-L}$ prior to providing such coefficient to the conditional logic unit 74.

The above-described root finding mechanism offers significant decoding speed advantages over a single conventional Chien search, most particularly when the hardware is employed to decode a fraction of the decoding power of the code. Consider, for example, the decoder 40 (of FIG. 4) designed to correct 17 symbol errors in a symbol code of n symbols, where n=446. As shown in Table 1 below, for this number of symbol errors, the decoder will compute r (where t=17 and r=2t=34) roots every t+1 (in this example, 18) cycles and thus requires a total of (t+1)*n/r cycles, that is, 18 cycles×446/34 or 234 cycles to find all 446 roots. The table shows that the rooting finding mechanism illustrated in FIGS. 5–6 can find all 446 roots 1.906 times faster than the single conventional Chien search circuit. Using the same hardware to correct 10 symbol errors takes 11 cycles ×446/r or 143 cycles, which is 3.119 times faster than the single conventional Chien search circuit.

TABLE 1

| Degree t of σ(x) | Total Cycles - New Approach | Total Cycles - Chien Search | Ratio |
| --- | --- | --- | --- |
| 17 | 234 | 446 | 1.906 |
| 16 | 221 | 446 | 2.018 |
| 15 | 208 | 446 | 2.144 |
| 14 | 195 | 446 | 2.287 |
| 13 | 182 | 446 | 2.451 |
| 12 | 169 | 446 | 2.639 |
| 11 | 156 | 446 | 2.859 |
| 10 | 143 | 446 | 3.119 |
| 9 | 130 | 446 | 3.431 |
| 8 | 117 | 446 | 3.812 |
| 7 | 104 | 446 | 4.288 |
| 6 | 91 | 446 | 4.901 |
| 5 | 78 | 446 | 5.718 |
| 4 | 65 | 446 | 6.862 |
| 3 | 52 | 446 | 8.577 |
| 2 | 39 | 446 | 11.436 |
| 1 | 26 | 446 | 17.154 |

The ratio is computed as the cycle time needed by one the cycle time needed by the proposed method. If two Chien search circuits are used in parallel, the ratio is reduced by half. Thus, for the same example, the present approach is 1.56 times faster than the two Chien search circuits in parallel.

Other Embodiments

It is to be understood that while the invention has been described in conjunction with the detailed description thereof, the foregoing description is intended to illustrate and not limit the scope of the invention, which is defined by the scope of the appended claims. Other embodiments are within the scope of the following claims. For instance, the unit 42 could be implemented to include some number r'>r of circuits 62 for r' elements of the Galois field. The coefficient multiplier circuit could be modified as appropriate. In such an implementation, only the first r circuits 62 corresponding to the first r powers of a would be used for the first mode of operation.

What is claimed is:

1. A method of operating a computation circuit in a decoder, the method comprising:

operating the computation circuit in a first mode to produce syndrome values in response to a first set of inputs; and operating the computation circuit in a second mode to produce location values in response to a second set of inputs.

2. The method of claim 1, wherein the first set of inputs corresponds to code word polynomial coefficients.

3. The method of claim 1, wherein the second set of inputs corresponds to error locator polynomial coefficients.

4. The method of claim 2, wherein operating the computation circuit in the first mode comprises:

using r computation stages to compute r syndromes.

5. The method of claim 3, wherein operating the computation circuit in the second mode comprises:
using r computation stages to compute greater than r location values.

6. A method of operating a computation circuit in a decoder, the method comprising:
operating the computation circuit in a first mode to produce syndrome values in response to a first set of inputs;
operating the computation circuit in a second mode to produce location values in response to a second set of inputs, the second set of inputs corresponding to coefficients of an error locator polynomial;
wherein operating the computation circuit in the second mode comprises using r computation stages to compute greater than r location values; and
wherein the error locator polynomial is of a degree t and wherein using the r computation stages further comprises computing a different one of the r location values in a corresponding one of the r computation stages during t+1 clock cycles.

7. The method of claim 6, wherein using the r computation stages further comprises:
computing a first consecutive r location values in a first t+1 clock cycles for the second set of inputs; and
scaling the second set of inputs for each next consecutive r location values to be computed; and
computing each next consecutive r location values for the scaled second set of inputs.

8. The method of claim 7, wherein scaling the second set of inputs includes multiplying each error locator polynomial coefficient in the second set of inputs by a Galois Field element so that location values are computed for Galois Field elements of a power greater than r.

9. The method of claim 8, wherein the power of the Galois Field element by which the error locator polynomial coefficients are multiplied is a multiple of r.

10. The method of claim 9, wherein using the r computation stages comprises:
maintaining the multiple of r as a count s;
initializing the count to one after the first consecutive r location values have been computed;
determining, after each next consecutive r location values is computed, if s*r+r is greater than or equal to the total number of location values to be computed; and
if s*r+r is determined to be not greater than or equal to the total number of location values to computed, then incrementing the count by one.

11. A method of operating a computation circuit in a decoder, the method comprising:
operating the computation circuit in a first mode to produce syndrome values in response to a first set of inputs;
operating the computation circuit in a second mode to produce location values in response to a second set of inputs, the second set of inputs corresponding to coefficients of an error locator polynomial;
comparing the computed location values to a zero value; and
if the computed location values are equal to a zero value, indicating that an error locator polynomial root from which an error location may be obtained has been found.

12. An apparatus, comprising:
a computation circuit; and
a control unit for enabling the computation circuit to operate in either a first mode or a second mode;
the computation circuit being adapted to compute syndrome values in response to a first set of inputs in the first mode; and
the computation circuit being adapted to compute location values in response to a second set of inputs in the second mode.

13. The apparatus of claim 12, wherein the first set of inputs corresponds to code word polynomial coefficients.

14. The apparatus of claim 12, wherein the second set of inputs corresponds to error locator polynomial coefficients.

15. The apparatus of claim 12, wherein the computation circuit includes r parallel computation stages.

16. The apparatus of claim 15, wherein the computation circuit computes r syndromes for the first set of inputs when enabled to operate in the first mode.

17. The apparatus of claim 15, wherein the computation circuit computes r location values for the second set of inputs when enabled to operate in the second mode.

18. An apparatus, comprising:
a computation circuit;
a control unit for enabling the computation circuit to operate in either a first mode or a second mode;
the computation circuit being adapted to compute syndrome values in response to a first set of inputs in the first mode;
the computation circuit being adapted to compute location values in response to a second set of inputs in the second mode;
wherein the computation circuit includes r parallel computation stages;
wherein the computation circuit computes r location values for the second set of inputs when enabled to operate in the second mode; and
wherein the error locator polynomial is of a degree t and wherein the computation circuit computes a different one of the r location values in a corresponding one of the r parallel computation stages during t+1 clock cycles.

19. The apparatus of claim 18, wherein the computation circuit resides in a computation unit having a coefficient multiplier circuit for scaling the second set of inputs when the number of location values to be computed in the second mode of operation is greater than r.

20. The apparatus of claim 19, wherein the coefficient multiplier circuit multiplies each error locator polynomial coefficient in the second set of inputs by a Galois Field element so that location values are computed for Galois Field elements of a power greater than r.

21. The apparatus of claim 20, wherein the power of the Galois Field element by which the error locator polynomial coefficients are multiplied is a multiple of r.

22. The apparatus of claim 21, wherein the multiple of r is maintained as a count that is initialized to one after a first r location values have been computed and is incremented by one after each next consecutive r location values is computed.

23. The apparatus of claim 22, further comprising:
a zero compare unit for comparing the location values computed by each of the parallel computation circuits to a zero value, the zero value indicative of an error locator polynomial root from which an error location may be obtained.

* * * * *